United States Patent
Moran et al.

(10) Patent No.: US 9,814,157 B2
(45) Date of Patent: Nov. 7, 2017

(54) WIRE MANAGEMENT AND WIRE ENTRY COVER BRACKET

(71) Applicant: SimplexGrinnell LP, Westminster, MA (US)

(72) Inventors: Michele Moran, Merrimack, NH (US); Joseph D. Farley, Warwick, MA (US)

(73) Assignee: TYCO FIRE & SECURITY GMBH, Neuhausen am Rheinfall (CH)

( * ) Notice: Subject to any disclaimer, the term of this patent is extended or adjusted under 35 U.S.C. 154(b) by 185 days.

(21) Appl. No.: 13/780,244

(22) Filed: Feb. 28, 2013

(65) Prior Publication Data
US 2014/0242835 A1    Aug. 28, 2014

(51) Int. Cl.
| | | |
|---|---|---|
| *H05K 7/14* | (2006.01) | |
| *H02G 3/08* | (2006.01) | |
| *H01R 13/639* | (2006.01) | |

(52) U.S. Cl.
CPC .......... *H05K 7/1491* (2013.01); *H02G 3/083* (2013.01); *H01R 13/6392* (2013.01); *Y10T 29/49952* (2015.01)

(58) Field of Classification Search
CPC .. H02G 3/32; H02G 3/083; F16L 3/24; H05K 7/1491; Y10T 29/49952
USPC .......... 174/66, 68.1, 68.3, 70 C, 72 A, 88 R; 248/65, 200; 361/724
See application file for complete search history.

(56) References Cited

U.S. PATENT DOCUMENTS

| | | | | |
|---|---|---|---|---|
| D315,289 S | * | 3/1991 | Rankin | D8/373 |
| 5,535,096 A | * | 7/1996 | Cliff, Jr. | 361/726 |
| 7,850,371 B2 | * | 12/2010 | Riley et al. | 385/77 |
| 7,927,126 B1 | * | 4/2011 | Bender | H01J 37/04 439/369 |
| D683,565 S | * | 6/2013 | Chou | D6/580 |
| 2002/0068477 A1 | * | 6/2002 | Chen-Chiang | H01R 13/6395 439/373 |
| 2006/0011380 A1 | * | 1/2006 | Pierce | 174/135 |
| 2006/0046557 A1 | * | 3/2006 | Pulizzi | H01R 13/5804 439/371 |
| 2008/0299824 A1 | * | 12/2008 | Legg | H01R 13/6395 439/595 |
| 2009/0239404 A1 | * | 9/2009 | Chen | H01R 13/748 439/345 |

(Continued)

OTHER PUBLICATIONS

NPL: Cisco. "Cisco STK-Rackmount-1RU Rackmount Brackets." Amazon. N.p., Sep. 4, 1999. Web. Feb. 19, 2016. URL: http://www.amazon.com/Cisco%ADSTK%ADRACK-MOUNT%AD1R%ADSTK%ADRACKMOUNT%AD1RU-%ADRackmount%ADBrackets/dp/B00007MDK5/ref=cm_cr_pr_product_top?ie=UTF8.*

(Continued)

*Primary Examiner* — Adrian S Wilson
*Assistant Examiner* — Abhishek Rathod (57) ABSTRACT

A bracket is disclosed for managing the entry of one or more wires into an opening of an electronic equipment chassis. The bracket includes mounting holes configured to accept fasteners for engaging the bracket to the chassis. The bracket also includes a wire support portion having openings for receiving ends of a cable tie to secure one or more wires to the bracket. A faceplate portion of the bracket is positionable to overlie the portion of the chassis opening that is not occupied by the wire(s) to prevent access to the interior of the chassis. A plurality of brackets can be provided for electronic equipment chassis that have multiple openings. Other embodiments are disclosed and claimed.

18 Claims, 9 Drawing Sheets

(56) References Cited

U.S. PATENT DOCUMENTS

2010/0171004 A1\* 7/2010 Young .................. 248/73
2010/0226616 A1\* 9/2010 Zheng ................. 385/137

OTHER PUBLICATIONS

NPL: Monster. "HTS Rack Ear Set—2 RU Rack Ear HTS." Amazon. N.p., Apr. 5, 2008. Web. Feb. 19, 2016. URL: http://www.amazon.com/gp/product/B0017CND2W?ie=UTF8&ref_=de_a_smtd&showDetailTechData=1#technical<sup>a</sup> data2/4.\*
NPL: Whelen, "Mirror15/20", Dec. 2007. Web. Aug. 4, 2016. URL: http://www.whelen.com/pb/Automotive/ProductSheets/Beacons/Mirror15-20.pdf.\*

\* cited by examiner

WIRE MANAGEMENT AND WIRE ENTRY COVER BRACKET

FIELD OF THE DISCLOSURE

The disclosure relates generally to the field of wire management, and more particularly to a structure for managing wires that enter into an equipment chassis.

BACKGROUND OF THE DISCLOSURE

Installation and management of electronic system wires requires precise placement, particularly where the wires enter or exit an electronic equipment chassis. Such placement should ensure that the wires are not damaged through interaction with the chassis opening or by over-bending.

Increases in bandwidth requirements for various electronic systems have resulted in ever more densely packed wiring arrangements. This, coupled with often limited floor space in which to place new equipment means that it is even more important to provide proper management of wires.

To provide a desired degree of management and protection of wiring, prior arrangements include enclosing wires in conduits. Such conduits, in addition to protecting the enclosed wires, can also be used to make a direct connection to an opening in the electronic equipment chassis. This provides the additional benefit that the chassis openings are completely covered, thus preventing access to the internals of the chassis during use.

As noted, for applications in which there is limited floor space in which to house electronic equipment, the chassis may need to be placed in the middle of the room. This may make the use of conduits impractical either due to their size, inflexibility, or other factors.

Thus, there remains a need for a system to organize wires entering and exiting from an electronic equipment chassis to prevent wire damage over the life of the equipment, and which can be used in any of a variety of applications and arrangements.

SUMMARY

In view of the foregoing a bracket is disclosed for organizing wires entering/exiting an electronics equipment chassis. The bracket is attached to the chassis in a manner that allows the chassis cover to be removed without having to remove the bracket or the wires attached to the bracket. In addition, the bracket is configured to cover the portion of the wire entry hole that is not occupied by wire so as to prevent access to the chassis internals.

The bracket prevents access to the internals of the chassis during use regardless of the number or size of cables passing through a particular opening. The bracket also supports a wide range of cables while still covering the respective opening regardless of the size of the opening and the number/size of wires passing therethrough.

For chassis arrangements having multiple wire entry holes, multiple brackets can be used, each of which can accommodate a different number and size of wire. The use of multiple brackets thus allows each wire entry hole to be covered independent from the others. Additionally, the bracket enables wire to be run in virtually any direction outside of the chassis (e.g., above the chassis, straight out of the chassis, or underneath the chassis).

A wire entry cover bracket is disclosed. The bracket may include a faceplate portion having a first opening for receiving a first fastener for securing the bracket to an electronic equipment chassis. The bracket may further include a wire support portion coupled to the faceplate portion. The wire support portion may have a second opening for receiving a second fastener for securing at least one wire to the bracket.

A wire entry cover bracket is disclosed, including a faceplate portion having a pair of first openings for receiving fasteners to secure the bracket to an electronic equipment chassis. The bracket may also include a wire support portion oriented substantially perpendicular to the faceplate portion. The wire support portion may have a pair of second openings for receiving a cable tie to secure a wire to the bracket.

A method is disclosed for mounting a wire to an electronic equipment chassis. The method may include providing a wire entry cover bracket including a faceplate portion having a pair of first openings for securing the bracket to an electronic equipment chassis, and a wire support portion oriented substantially perpendicular to the faceplate portion, the wire support portion having a pair of second openings for securing the wire to the bracket. The method may further include attaching the wire entry cover bracket to the electronic equipment chassis using fasteners inserted into the pair of first openings, and securing a wire to the wire support portion using a cable tie inserted into the pair of second openings.

BRIEF DESCRIPTION OF THE DRAWINGS

By way of example, specific embodiments of the disclosed device will now be described, with reference to the accompanying drawings, in which.

DETAILED DESCRIPTION

For the sake of convenience and clarity, terms such as "front," "rear," "top," "bottom," "up," "down," "inwardly," "outwardly," "lateral," and "longitudinal" will be used herein to describe the relative placement and orientation of the disclosed bracket, as it appears in the figures. Said terminology will include the words specifically mentioned, derivatives thereof, and words of similar import.

Referring now to FIGS. 1-4, a bracket 1 is shown. The bracket 1 may include a faceplate portion 2 and a wire support portion 4. In the illustrated embodiment the faceplate and wire support portions 2, 4 are oriented perpendicular with respect to each other. It will be appreciated, however, that this angle is not critical and thus the portions may be oriented at other angles with respect to each other depending upon the particular application.

The faceplate portion 2 may have a central facing region 6, and a pair of side flanges 8, 10. Openings 12, 14 may be positioned in the pair of side flanges 8, 10. These openings 12, 14 may be sized and configured to receive respective fasteners, such as screws, for fixing the bracket 1 to an electronics equipment chassis as will be described in greater detail later. To provide for an enhanced degree of adjustability, the openings 12, 14 may be elongated to enable the fasteners to engage the faceplate portion 2 at a variety of locations. In the illustrated embodiment the openings are elongated along the vertical direction. It will be appreciated, however, that the openings could alternatively be elongated in another direction, such as the horizontal direction, to enable alternative adjustability.

A forward edge 16 of the wire support portion 4 may be connected to a bottom end 18 of the central facing region 6 of the faceplate portion 2. In one embodiment, the faceplate portion 2 and the wire support portion 4 are formed from a single piece of material, and the two are bent with respect to each other along ends 16, 18. Alternatively, the portions may be formed as separate pieces and connected via welding, brazing, or other appropriate joining technique.

The wire support portion 4 may include a pair of openings 20, 22 spaced on laterally opposite sides of a support section 24. These openings 20, 22 can be sized to receive a fastener 26 (see FIGS. 7 and 8) for securing a portion of a wire 28 to be routed into an electronics equipment chassis 30. In one embodiment, the fastener 26 may be a cable tie looped through the openings 20, 22 and around the wire 28. Other fasteners, such as tie-wires, string, rubber bands, and the like could alternatively be used.

The side flanges 8, 10 may extend below the bottom end 18 of the central facing region 6 by an offset distance "OSD." Thus, the bottom edges 32 of the side flanges 8, 10 may extend below the wire support portion 4. In the illustrated embodiment, the openings 12, 14 in the side flanges 8, 10 also extend below the wire support portion 4. This arrangement provides for a large degree of adjustability in the vertical positioning of the bracket 1 with respect to the electronics equipment chassis 30 so that the bracket 1 can be used to secure a wide variety of wire types, sizes and numbers, to the chassis.

Figure 1:
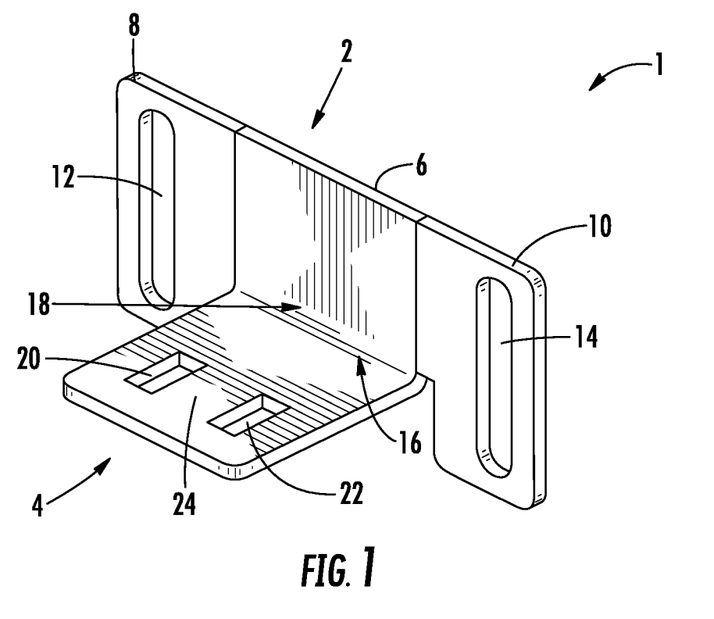
FIG. 1 is a perspective view illustrating an embodiment of a wire management and wire entry cover bracket in accordance with the present disclosure.
Figure 2:
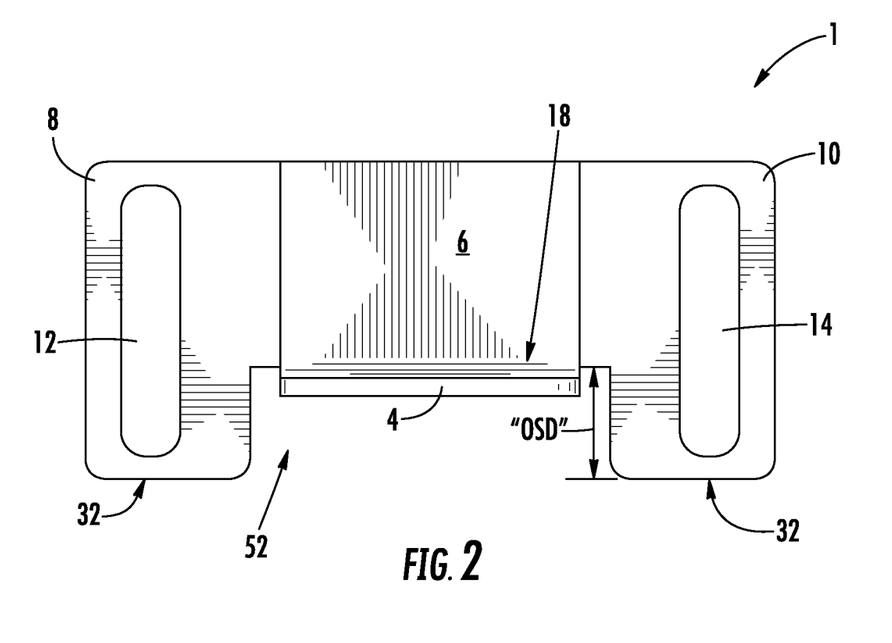
FIG. 2 is a top plan view of the bracket of FIG. 1.
Figure 3:
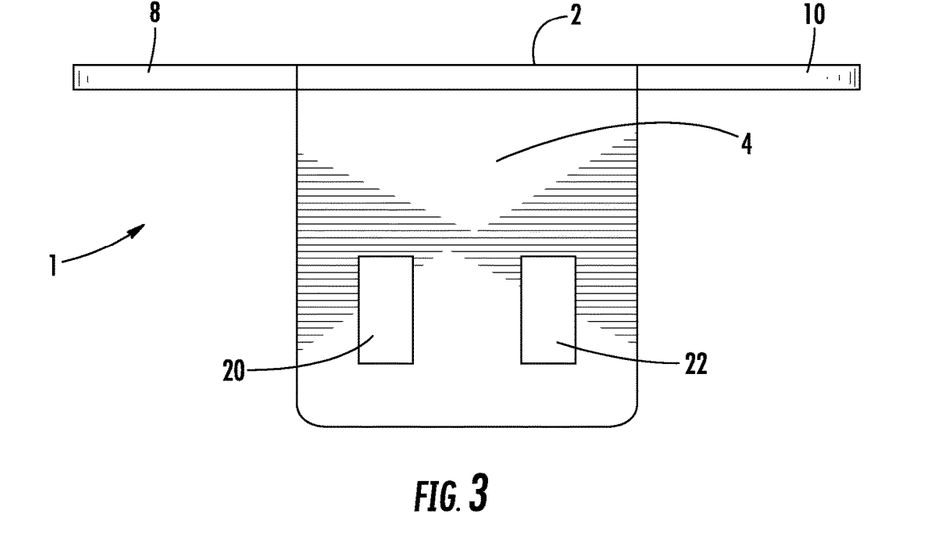
FIG. 3 is a bottom plan view of the bracket of FIG. 1.
Figure 4:
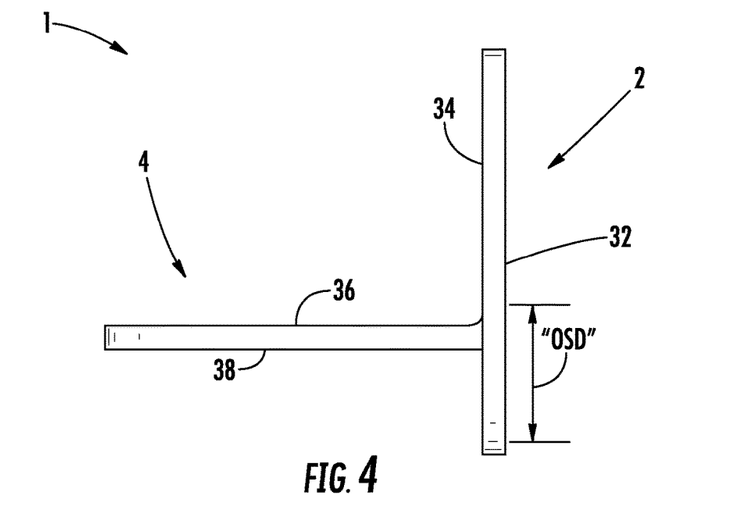
FIG. 4 is a side view of the bracket of FIG. 1.
Figure 5:
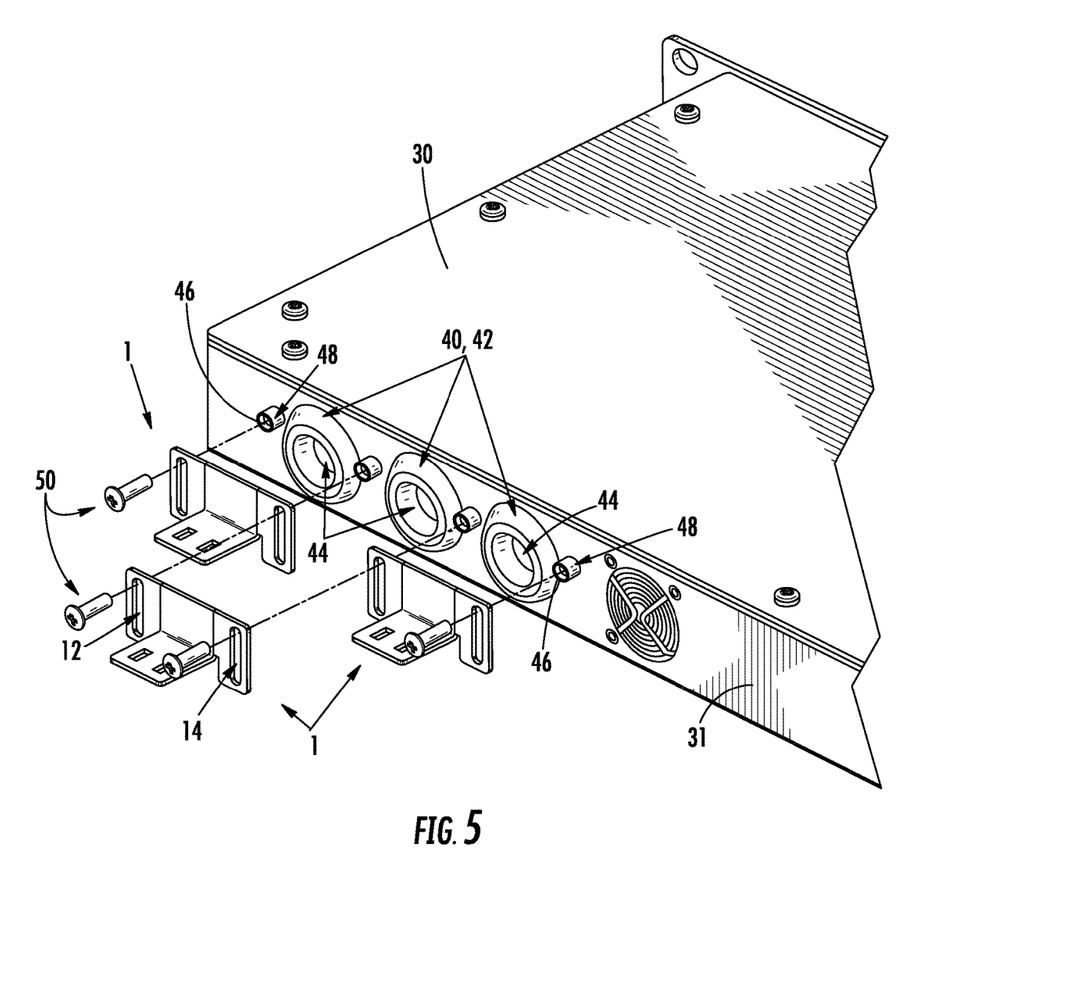
FIG. 5 is a perspective view of a plurality of brackets according to FIG. 1 disposed adjacent an exemplary chassis.
Figure 6:
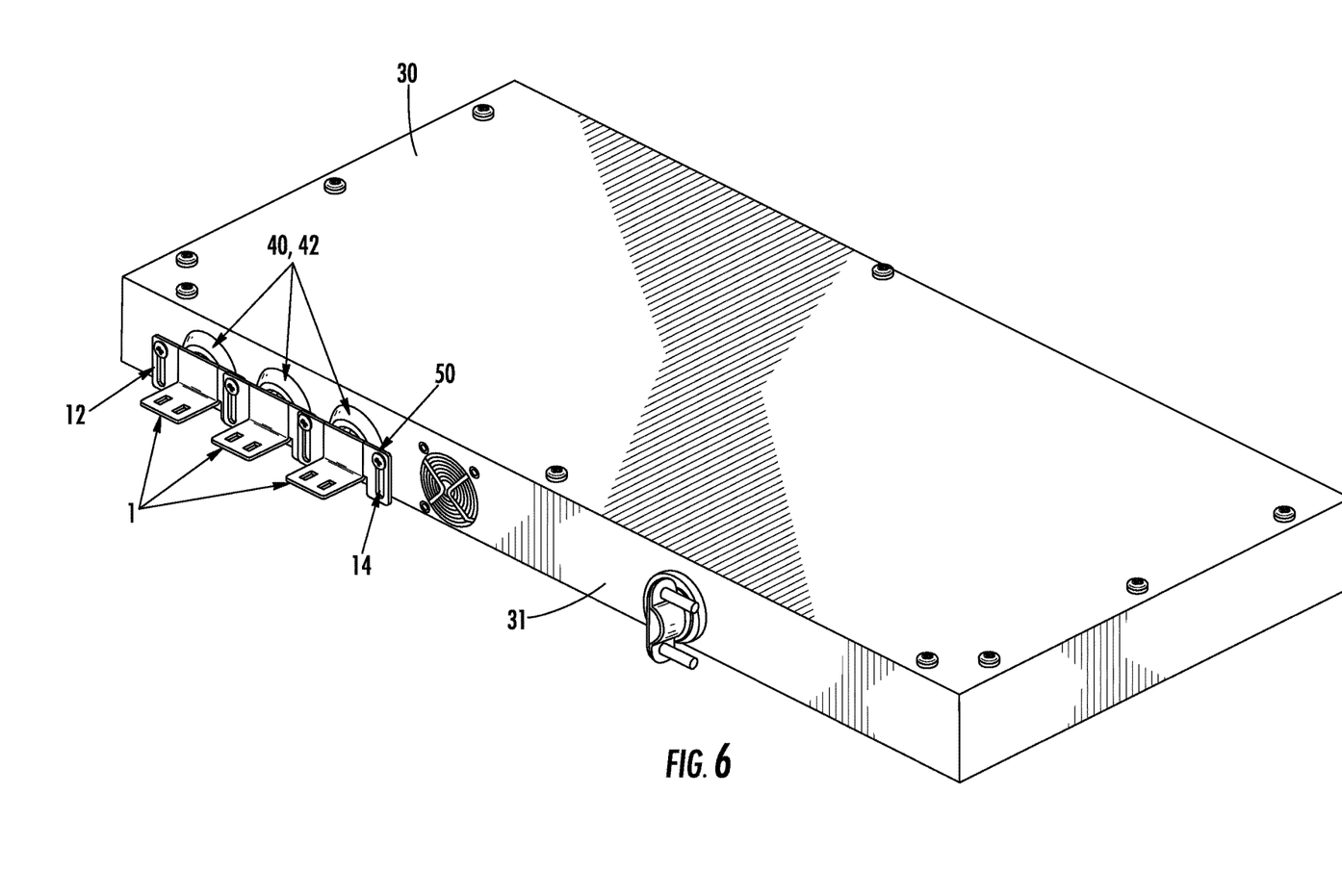
FIG. 6 is a perspective view of a plurality of brackets according to FIG. 1 engaged with an exemplary chassis.

As can be seen best with reference to FIG. 4, the central facing region 6 may have a front face 32 and a back face 34, while the wire support portion 4 may have an upper surface 36 and a lower surface 38. As shown in FIGS. 5 and 6, the front face 32 of the faceplate portion 2 serves to cover the associated wire entry hole 40 in the electronics equipment chassis 30, while the lower surface 38 of the wire support portion 4 engages one or more wires 28 that are fed through the wire entry hole (FIGS. 7 and 8).

Referring to FIGS. 5 and 6, an exemplary electronics equipment chassis 30 is shown as a generally rectangular box having a plurality of wire entry holes 40 disposed in a side wall 31 thereof. The illustrated wire entry holes 40 are circular and may each have a non-metallic grommet 42 lining the inner periphery of the hole. It will be appreciated, however, that the wire entry holes can be non-circular, and need not include a grommet. The non-metallic grommets 42 have openings 44 for receiving one or more wires therethrough so as to connect to electronic components containing within the chassis 30. As can be seen, the brackets 1 can be positioned in front of respective ones of the plurality of wire entry holes 40 so that the openings 12, 14 of each of the brackets aligns with associated openings 46 in the chassis 30. In the illustrated embodiment, the openings 46 are disposed within standoffs 48 fixed to the side wall 31 of the chassis 30. As will be appreciated, the standoffs 48 compensate for the presence of the grommets 42 which may protrude beyond the front of the sidewall 31 of the chassis. The brackets 1 may be fixed to the standoffs via fasteners 50, such as screws, disposed within the bracket openings 12, 14. FIG. 6 shows the brackets 1 firmly fixed to the chassis 30.

As can be seen in FIG. 6, the fasteners 50 are positioned near the top ends of the bracket openings 12, 14 so that the central facing region 6 substantially covers the openings 44 of each of the grommets 42. As can also be seen, the center positioned bracket 1 shares a fastener 50 with each of the right and left positioned brackets 1, thus providing an economical design from a space standpoint.

Figure 7:
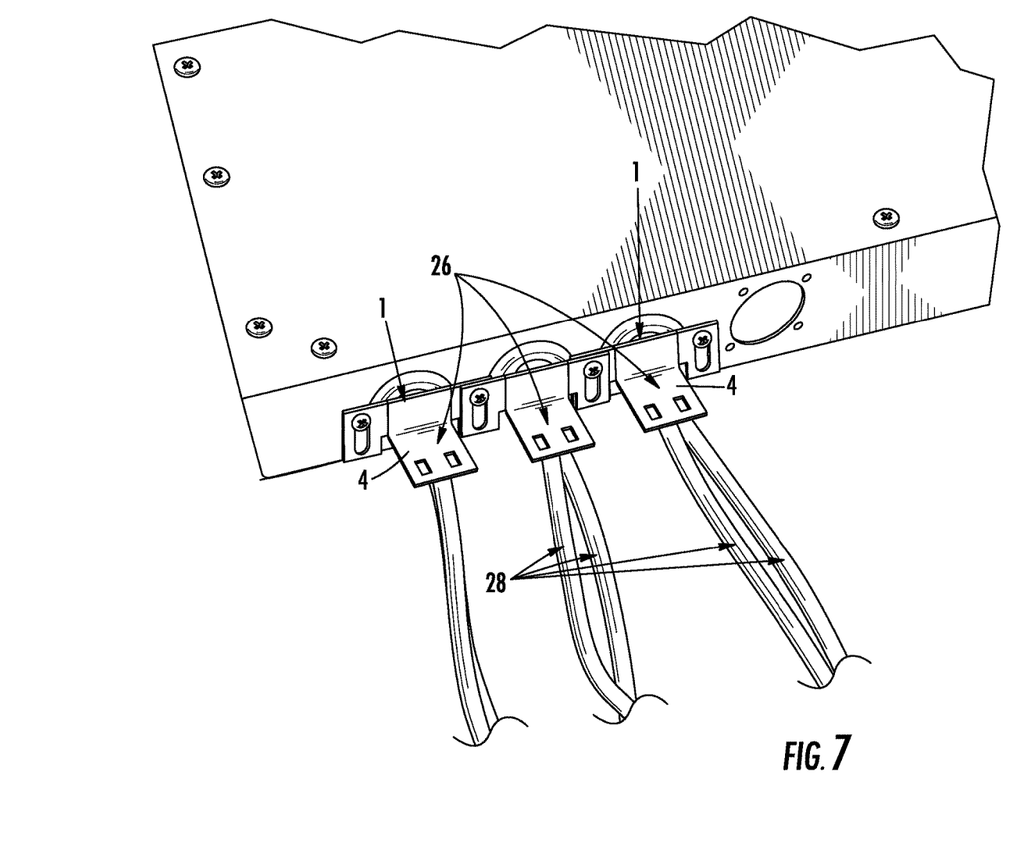
FIG. 7 is a first perspective view of a plurality of brackets according to FIG. 1 engaged with an exemplary chassis, the plurality of brackets arranged to support a plurality of wires entering the chassis through respective wire entry openings and to cover a portion of each of the respective wire entry openings.
Figure 8:
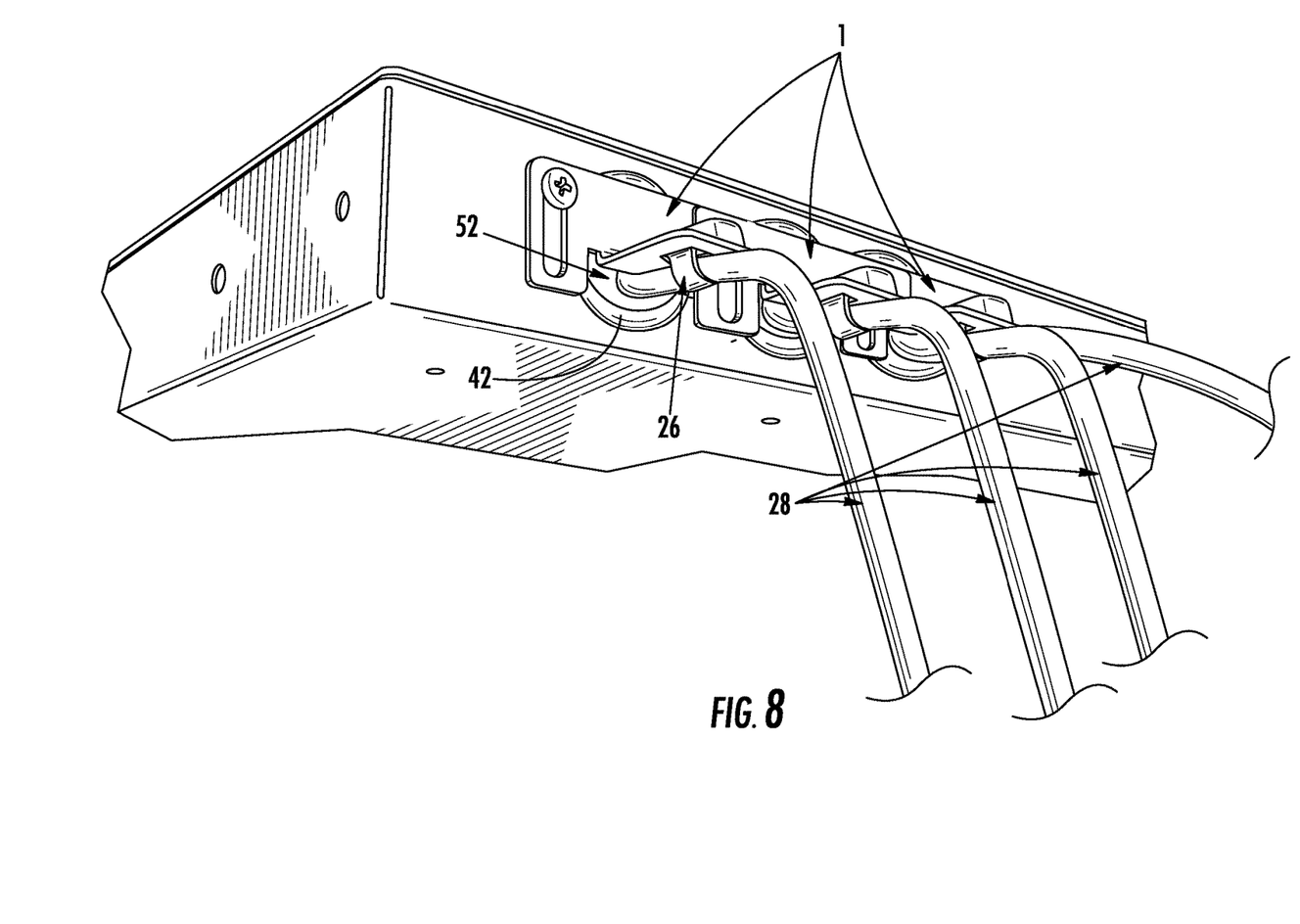
FIG. 8 is a second perspective view of a plurality of brackets according to FIG. 1 engaged with an exemplary chassis, the plurality of brackets arranged to support a plurality of wires entering the chassis through respective wire entry openings and to cover a portion of each of the respective wire entry openings.

FIGS. 7 and 8 show the exemplary electronics equipment chassis 30 with a plurality of wires 28 supported by a plurality of brackets 1. The wires 28 are engaged with the support portion 4 of each bracket via a cable tie fastener 26. The wires 28 are positioned beneath the wire support portions 4 so that they engage the lower surface 38 (FIG. 4) of the portions 4. Thus arranged, the wires 28 enter the respective openings 40 in the sidewall 31 of the chassis 30. The central facing region 6 of each bracket 1 covers the respective opening 40, and the wires enter the openings 40 in the space 52 formed by the lower edge 18 of the central facing portion 2, the lower surface 38 of the wire support portion 4, and the bottom edges 32 of the side flanges 8, 10 (FIG. 4). FIG. 8 shows that the openings 40 are covered on the bottom by the wires 28 and on the top by the faceplate portions 2 of the brackets 1.

Figure 9:
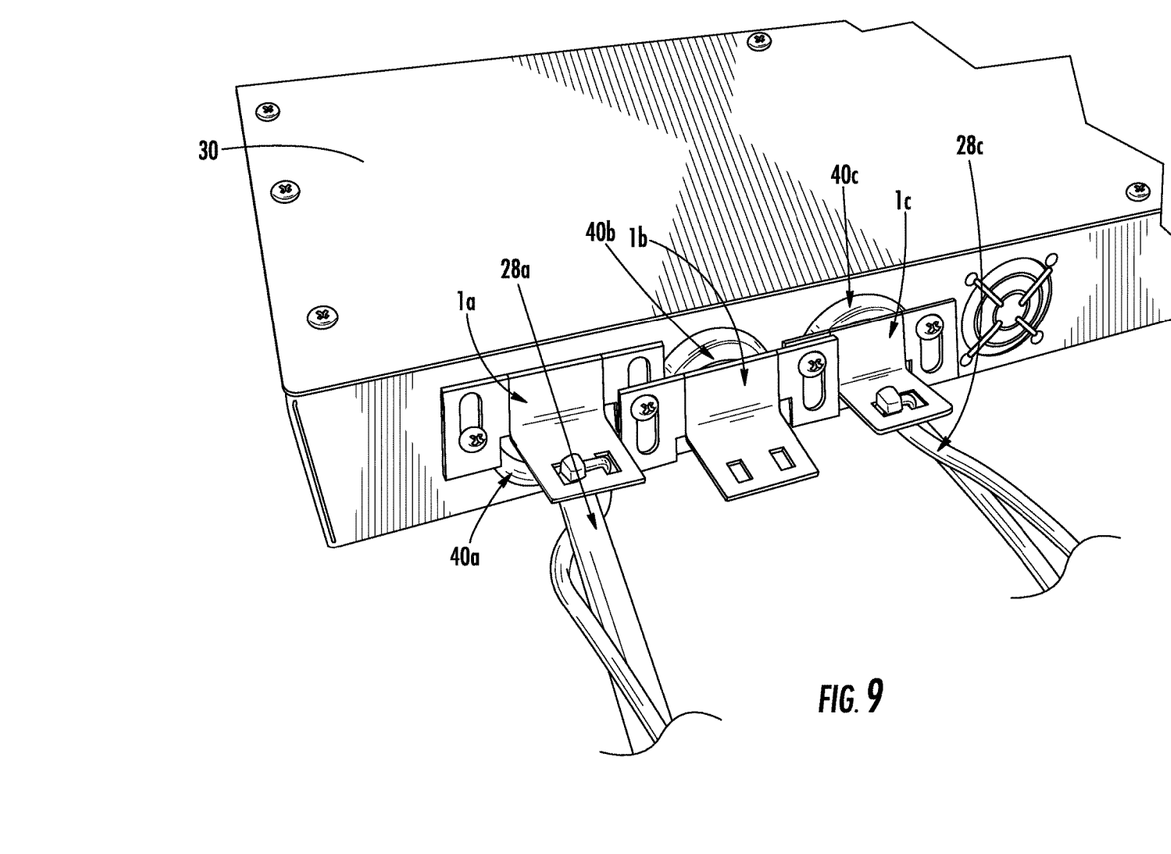
FIGS. 9 and 10 are third and fourth perspective views, respectively, of a plurality of brackets according to FIG. 1 engaged with an exemplary chassis, the plurality of brackets arranged to support a differing number and size of wires entering the chassis through respective wire entry openings.
Figure 10:
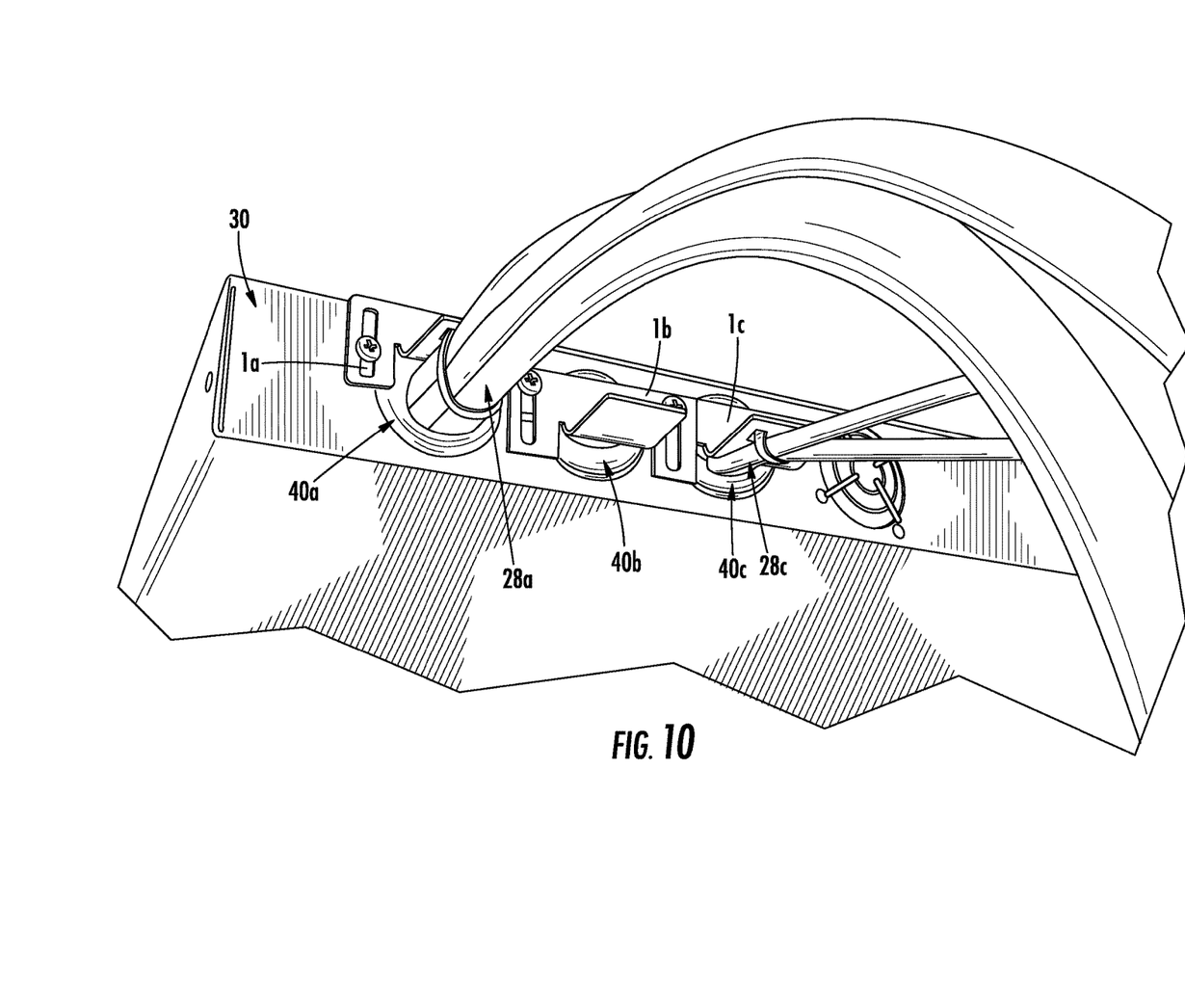

FIGS. 9 and 10 show another arrangement of the exemplary electronics equipment chassis 30 with a plurality of wires supported by a plurality of brackets. In these views it can be seen that each of the brackets 1 is adjusted to a different height with respect to the associated opening 40 to accommodate a smaller or larger number of wires (or no wires at all). Thus, as can be seen, the leftmost bracket 1a associated with the leftmost opening 40a is adjusted upward with respect to the opening so as to accommodate a wire group 28a that includes relatively large number of wires. The center bracket 1b associated with the center opening 40b is adjusted to a maximum downward position so as to cover almost the entire opening, since no wires reside in that opening. The right-most bracket 1c associated with the rightmost opening 40c is adjusted higher than center bracket 1b so as to accommodate the associated wire group 28c. The right-most bracket 1c is, however, adjusted lower than leftmost bracket 1a since the wire group 28c is smaller than wire group 28a associated with the rightmost opening 40a.

As FIGS. 9 and 10 show, the disclosed bracket 1 can be easily adjusted to customize the fit to a particular arrangement of openings, wire sizes and wire numbers. As a result, the brackets 1 serve a desired wire-support function while also providing maximum coverage of the opening through which the wires are placed. As will be appreciated, this adjustability is further facilitated by the use of cable tie fasteners 26 to engage the wire groups with their associated brackets.

Figure 11:
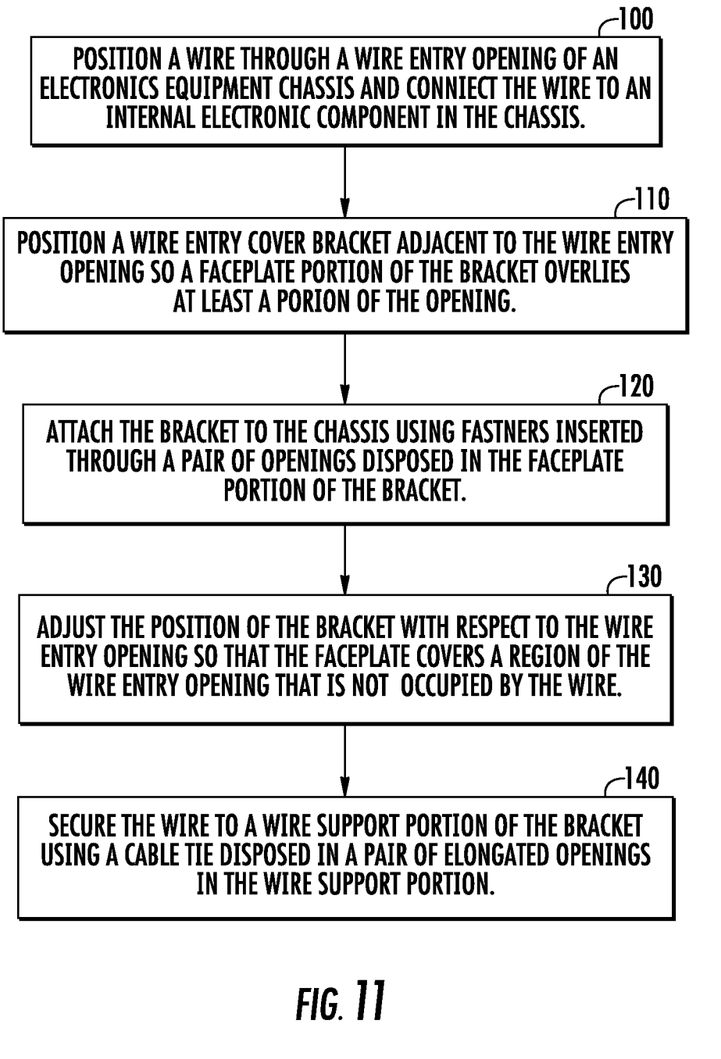
FIG. 11 is an exemplary method for organizing wires according to the disclosure.

Referring now to FIG. 11, an exemplary method according for mounting a wire to an electronic equipment chassis will be described. At step 100, a wire may be positioned through a wire entry opening of an electronics equipment chassis and connected to an internal electronic component in the chassis. At step 110, a wire entry cover bracket 1 may be positioned adjacent to the wire entry opening so that a faceplate portion 2 of the bracket overlies at least a portion of the opening. At step 120, the wire bracket 1 may be attached to the chassis using fasteners inserted through a pair of openings disposed in the faceplate portion 2 of the bracket. In one embodiment, the openings are elongated in a vertical orientation. At step 130, the position of the bracket may be adjusted with respect to the wire entry opening so that the faceplate portion 2 covers a region of the wire entry opening that is not occupied by the wire. At step 140, the wire may be secured to a wire support portion 4 of the bracket using a cable tie disposed in a pair of elongated openings in the wire support portion.

One advantage of the disclosed design is that the brackets 1 attach to the sidewall 31 of the chassis 30, thus allowing a user to access the internal components of the chassis by removing the chassis cover, and without disturbing the management of the wiring.

The bracket also allows the unoccupied area of the wire entry hole (i.e., the portion not occupied by wires) to be covered regardless of the number and size of wires or cable routed through the hole when conduit is not used. Each wire entry hole can be covered independently from the others allowing greater flexibility when wiring the unit. Additionally, it will be appreciated that use of a cable tie to secure the wires to the bracket is not required, such that the bracket may be used to cover a wire entry hole even without the use of a cable tie to organize the wires.

In one non-limiting exemplary embodiment, the bracket 1 may be made from an aluminum alloy. It will be appreciated that other materials, including other metals, polymers and the like may also be used without departing from the scope of the disclosure.

As used herein, an element or step recited in the singular and proceeded with the word "a" or "an" should be understood as not excluding plural elements or steps, unless such exclusion is explicitly recited. Furthermore, references to "one embodiment" of the present invention are not intended to be interpreted as excluding the existence of additional embodiments that also incorporate the recited features.

While certain embodiments of the disclosure have been described herein, it is not intended that the disclosure be limited thereto, as it is intended that the disclosure be as broad in scope as the art will allow and that the specification be read likewise. Therefore, the above description should not be construed as limiting, but merely as exemplifications of particular embodiments. Those skilled in the art will envision other modifications within the scope and spirit of the claims appended hereto.

What is claimed is:

1. A wire management assembly, comprising:
   a first bracket adjacent a second bracket, each of the first and second brackets including:
      a faceplate portion having a central region;
      a flange extending from one side of the central region, the flange comprising an elongate opening; and
      a wire support portion extending perpendicularly from the faceplate portion, the wire support portion comprising means for securing a first wire to the first bracket and a second wire to the second bracket,
   wherein each of the first and second brackets at least partially covers a respective wire entry opening in an electronic equipment chassis,
   wherein the flange of the first bracket overlaps with the flange of the second bracket such that the elongate opening of the flange of the first bracket overlaps with the elongate opening of the flange of the second bracket,
   wherein a fastener extends through the overlapping elongate openings to secure each faceplate portion to the electronic equipment chassis, and
   wherein the overlapping flanges of the first and second brackets are permitted to slide relative to the fastener in a direction parallel to the faceplate portion to adjust a position of the first bracket and the second bracket with respect to one another to substantially cover each respective wire entry opening.

2. The wire management assembly of claim 1, wherein the fastener comprises a screw and the means for securing the first wire to the first bracket and the second wire to the second bracket comprises a cable tie.

3. The wire management assembly of claim 1, wherein the flange further comprises a pair of side flanges each extending from opposite sides of the central region, wherein the elongate opening is formed in each of the pair of side flanges.

4. The wire management assembly of claim 1, wherein the means for securing the first wire to the first bracket and the second wire to the second bracket comprises a pair of openings disposed on opposite lateral sides of the wire support portion.

5. The wire management assembly of claim 1, wherein the elongate opening is positioned to overlie a fastener opening in the electronic equipment chassis.

6. The wire management assembly of claim 1, wherein the elongate opening extends above and below a first end of the central region for allowing adjustable positioning of each of the first and second brackets with respect to each respective wire entry opening in the electronic equipment chassis.

7. The wire management assembly of claim 1, wherein the wire support portion is configured to receive a set of cable ties to engage the first and second wires so that tensile, compressive, twisting, and flexing forces applied to the first and second wires are isolated to each of the first and second brackets, and will not be transmitted to a component connected to the first and second wires within the electronic equipment chassis.

8. A wire management assembly, comprising:
   a first bracket and a second bracket each including:
      a faceplate portion having a central region;
      a pair of flanges extending from opposing sides of the central region, each of the pair of flanges including an elongate opening;
      a wire support portion extending perpendicular to the faceplate portion, the wire support portion comprising means to secure a first wire to the first bracket and a second wire to the second bracket,
   wherein each of the first and second brackets at least partially covers a respective wire entry opening in an electronic equipment chassis,
   wherein one flange of the pair of flanges of the first bracket overlaps with one flange of the pair of flanges of the second bracket such that one of the elongate openings of the pair of flanges of the first bracket overlaps with one of the elongate openings of the pair of flanges of the second bracket, wherein a fastener extends through the overlapping elongate openings to secure each faceplate portion to the electronic equipment chassis, and wherein the overlapping flanges of the first and second brackets are permitted to slide relative to the fastener in a direction parallel to the faceplate portion to adjust a position of the first bracket and the second bracket with respect to one another to substantially cover each respective wire entry opening.

9. The wire management assembly of claim 8, wherein the means for securing the first wire to the first bracket and the second wire to the second bracket comprises a pair of second openings disposed on opposite lateral sides of the wire support portion.

10. The wire management assembly of claim 8, wherein each elongate opening of each of the first and second brackets is positioned to overlie a fastener opening in the electronic equipment chassis.

11. The wire management assembly of claim 8, wherein the elongate openings extend above and below a first end of the central facing region to enable adjustable positioning of each of the first and second brackets with respect to each respective first and second wire entry opening in the electronic equipment chassis.

12. The wire management assembly of claim 8, wherein the wire support portion is configured to engage the first and second wires extending into each respective wire entry opening in the electronic equipment chassis so that tensile, compressive, twisting, and flexing forces applied to the first and second wires are isolated to the first and second brackets, and will not be transmitted to a component connected to the wire within the electronic equipment chassis.

13. A method of mounting a wire to an electronic equipment chassis, the method comprising:

providing a plurality of brackets each comprising:
  a faceplate portion having a central section;
  a pair of flanges extending from the central section, each of the pair of flanges comprising an elongate opening; and
  a wire support portion extending perpendicular to the faceplate portion, the wire support portion having a pair of second openings for securing the wire;

wherein each of the plurality of brackets at least partially covers a respective wire entry opening in the electronic equipment chassis, wherein one flange of the pair of flanges of a first bracket of the plurality of brackets overlaps with one flange of the pair of flanges of a second bracket of the plurality of brackets such that one of the elongate openings of the pair of flanges of the first bracket overlaps with one of the elongate openings of the pair of flanges of the second bracket, wherein a fastener extends through the overlapping elongate openings to secure each faceplate portion to the electronic equipment chassis, and wherein the overlapping flanges of the first and second brackets are permitted to slide relative to the fastener in a direction parallel to the faceplate portion to adjust a position of the first bracket and the second bracket with respect to one another to substantially cover each respective wire entry opening; the method further comprising:

attaching the plurality of wire entry cover brackets to the electronic equipment chassis using the fastener inserted into the overlapping elongate openings; and securing a wire to the wire support portion using a cable tie inserted into the pair of second openings.

14. The method of claim 13, wherein the elongate openings extend above and below a first end of the central facing region, the method further comprising adjusting a position of each of the plurality of wire entry cover brackets with respect to each respective wire entry opening in the electronic equipment chassis prior to fixing each of the plurality brackets to the electronic equipment chassis using the fasteners inserted through the overlapping elongate openings.

15. The method of claim 14, wherein adjusting a position of one or more of the plurality of brackets comprises covering a portion of the respective wire entry opening with the faceplate portion to prevent access to the interior of the electronic equipment chassis after the plurality of brackets is fixed to the electronic equipment chassis.

16. The method of claim 14, wherein the elongate openings are oriented to allow vertical adjustment of each of the plurality of brackets with respect to the electronic equipment chassis before the plurality of brackets is fixed to the electronic equipment chassis using the fasteners.

17. The method of claim 13, wherein the step of attaching the plurality of brackets to the electronic equipment chassis comprises provisionally engaging each of the plurality of brackets to the electronic equipment chassis, and wherein each of the plurality brackets is fixed to the electronic equipment chassis after the step of securing the wire to the wire support portion.

18. The method of claim 13, wherein the step of securing the wire to the wire support portion is performed before the step of attaching the plurality of brackets to the electronic equipment chassis.

\* \* \* \* \*